United States Patent [19]

Wang et al.

[11] 4,001,099
[45] Jan. 4, 1977

[54] PHOTOSENSITIVE CAMERA TUBE TARGET PRIMARILY OF LEAD MONOXIDE

[75] Inventors: Chih Chun Wang, Hightstown; Thomas Clifford Lausman, Cranbury; Ronald Frank Bates, Trenton, all of N.J.

[73] Assignee: RCA Corporation, New York, N.Y.

[22] Filed: Mar. 3, 1976

[21] Appl. No.: 663,631

[52] U.S. Cl. .................. 204/164; 427/39; 427/74; 427/248 R; 427/248 C; 427/294; 427/314

[51] Int. Cl.² .................. B01K 1/00; B05D 5/12

[58] Field of Search ............. 427/74, 248 R, 248 C, 427/294, 314, 39; 204/164; 148/178; 313/366

[56] References Cited

UNITED STATES PATENTS

| | | | |
|---|---|---|---|
| 3,307,983 | 3/1967 | deHaan | 427/248 |
| 3,372,056 | 3/1968 | deHaan | 427/38 |
| 3,444,412 | 5/1969 | deHaan | 427/74 |
| 3,500,099 | 3/1970 | Taylor | 427/74 |
| 3,536,462 | 10/1970 | Eyster | 65/32 |

*Primary Examiner*—Michael F. Esposito
*Attorney, Agent, or Firm*—Glenn H. Bruestle; Robert J. Boivin

[57] ABSTRACT

A photosensitive layer comprising primarily lead monoxide is deposited on a signal electrode of a vidicon camera tube target. The deposition is carried out in an atmosphere containing oxygen and deuterium oxide. The vidicon target formed exhibits improved transient response leg properties and hole transport characteristics.

5 Claims, 2 Drawing Figures

PHOTOSENSITIVE CAMERA TUBE TARGET PRIMARILY OF LEAD MONOXIDE

BACKGROUND OF THE INVENTION

The invention relates generally to methods of forming photoconductive layers comprising primarily lead monoxide (PbO) and, more particularly to such layers suited for use as photoconductive targets in camera tubes, such as vidicons.

In general, photoconductive layers of this type include regions of different conductivity type material lying one behind the other in the direction of thickness of the layer. A p-n barrier or junction is formed at the boundary region between the adjacent zones of different conductivity.

Certain prior art techniques are known for the manufacture of photoconductive lead oxide layers. These include, for example, the techniques described in the following U.S. Patents issued to E. F. deHaan et al.:

| 3,289,024 | issued on | November 29, 1966, |
|---|---|---|
| 3,307,983 | " | March 7, 1967, |
| 3,372,056 | " | March 5, 1968, and |
| 3,444,412 | " | May 13, 1969. |

In the manufacture of devices which incorporate such photoconductive lead monoxide layers, certain deficiencies in the prior art processing methods have resulted in inconsistent and particularly poor yield of devices having desired lag characteristics particularly at low light levels.

Camera tubes of the type described display lag effects which result from inherent delays in the response of the photoconductive target material to changing light levels. This photoconductive lag is governed by the quality of the target material, which in turn is largely determined by the methods of preparation.

The lag effects control the build up or decay of signal output after the application or removal of light from the input surface of the camera tube. On a television picture this is seen as a short term image retention. The lag is an important property in camera tube characteristics particularly at low light levels since lag increases with decreasing light level. Also, because of the low blue light sensitivity of such camera tubes, the selection of low lag lead monoxide tubes suitable for the blue channel in a three tube TV camera is very critical. Presently, lead monoxide type camera tubes for special applications such as the blue channel of a TV camera, are carefully selected and screened for adequate lag performance from lots of tubes which are manufactured. A very low yield of such tubes is found when presently known techniques are employed in their manufacture.

A reliable method is desired for manufacturing devices having photoconductive lead monoxide layers with significantly improved yield of devices having improved lag characteristics.

SUMMARY OF THE INVENTION

A photosensitive layer consisting primarily of lead monoxide is deposited on a faceplate coated with a signal electrode. The deposition is carried out in an atmosphere containing oxygen and deuterium oxide ($D_2O$).

DESCRIPTION OF THE PREFERRED EMBODIMENT

Figure 1:
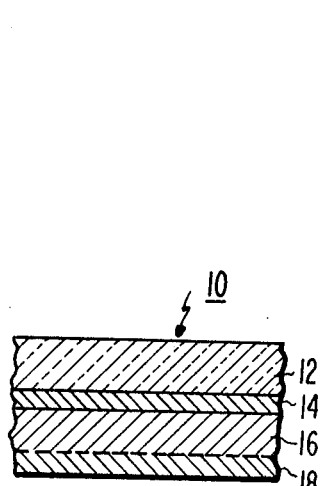
Fig. 1 is a partial cross-sectional view of a target for a vidicon camera tube made in accordance with the invention.

Referring to Fig. 1, the preferred embodiment of a photoconductor target 10 comprising primarily lead monoxide for a vidicon camera tube is shown. Such targets, and their operation, are well known in the art of camera pick-up tubes generally, and include: a faceplate 12, of an evacuated glass envelope; a conductive coating 14, such as tin oxide on a major surface of faceplate 12; and a thin layer consisting primarily of lead monoxide on a major surface of coating 14 not in contact with faceplate 12. Generally, the lead monoxide layer in such devices comprises two regions 16 and 18 of differing electrical conductivity. In manufacture, a layer 16 of compensated intrinsic, or of n-type conductivity, lead monoxide is first deposited upon the tin oxide coating 14. Thereafter, the region 18 of substantially P type conductivity lead monoxide is formed on the layer 16.

In the manufacture of lead monoxide type vidicons, the first and second regions 16 and 18 of lead monoxide must be uniformly and carefully formed on a layer of tin oxide 14 which is ordinarily predeposited on the faceplate 12 of a tubular envelope. The degree to which vidicon targets 10 display desired characteristics, is largely a function of the processing methods employed in forming the regions 16 and 18 of lead monoxide, and of the later sealing assembly of the envelope containing the target formed thereby with other necessary components of the vidicon. An improved method of assembling, sealing, and evacuating envelopes incorporating a target such as 10 depicted in FIG. 1, is fully described, for example, in U.S. Pat. No. 3,536,462 issued to A. D. Eyster et al. on Oct. 27, 1970.

Figure 2:
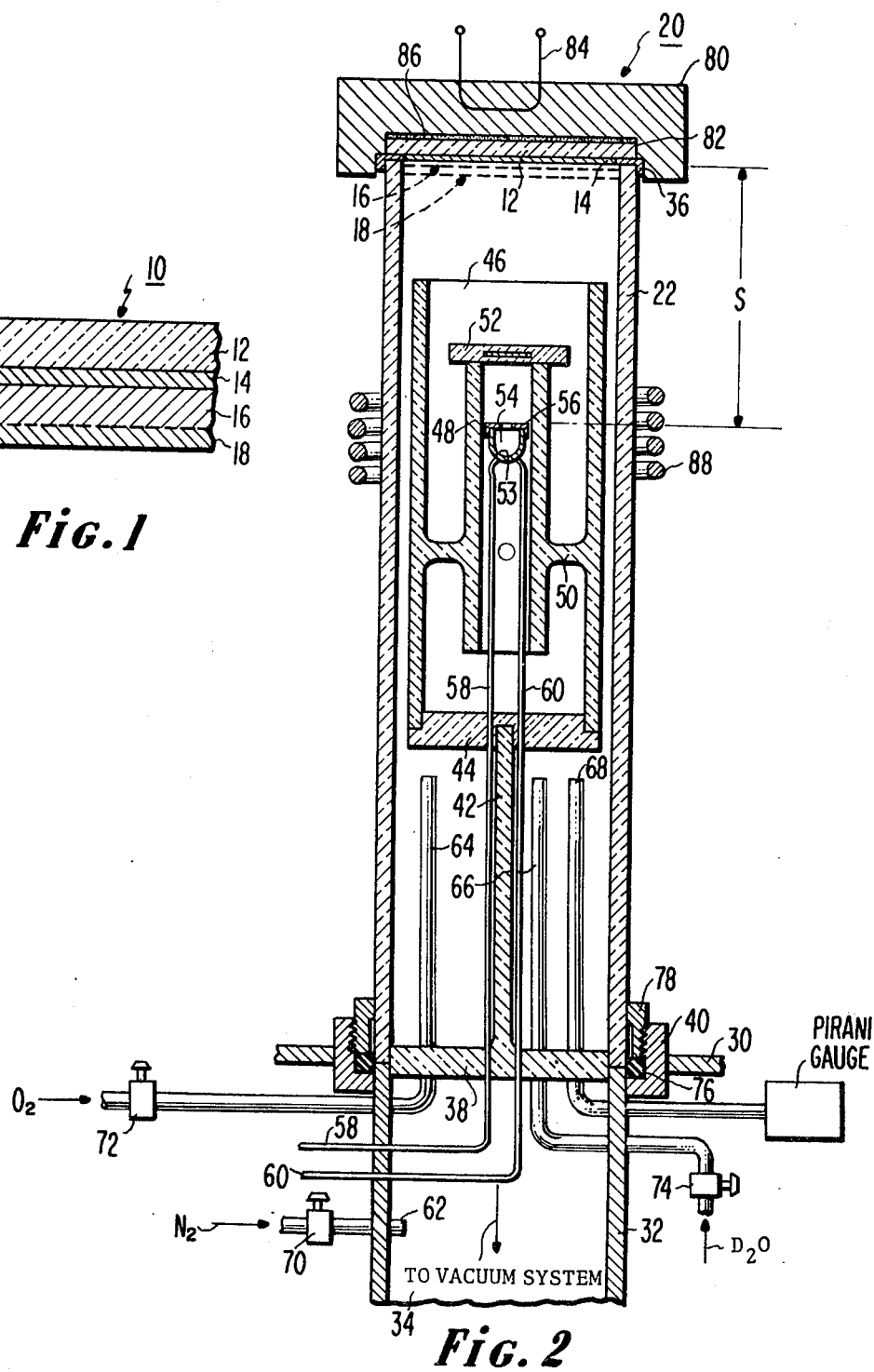
Fig. 2 is a cross-sectional view of one embodiment of an apparatus for practicing the method herein disclosed.

In FIG. 2, there is shown a processing apparatus 20, with a glass envelope workpiece 22 mounted thereon, that may be used in practicing the disclosed method of forming lead monoxide regions 16 and 18 as part of the target 10 (FIG. 1).

THE APPARATUS

A portion of apparatus 20 that serves an evacuating and evaporation function comprises a table 30 supporting a tubular metallic manifold 32 having an upper end adapted to support a lower end of a tubular glass envelope workpiece 22 as shown in FIG. 2. A lower end 34 of the manifold 32 is connected to a vacuum pump system, not shown. The pump system may consist of a diffusion pump and a forepump. The diffusion pump preferably employs mercury as the pumping fluid. The forepump is preferably of the cryosorption type requiring no pumping fluid. The forepump is filled with porous molecular seive material that captures gases by physical absorption. When chilled with low temperature liquid, such as liquid nitrogen, the pump quickly evacuates the apparatus 20. Because of the absence of hydrocarbon fluids conventionally used in a mechanical forepump, the cryosorption pump offers a high degree of cleanliness with no backstreaming of oil.

The upper end of the workpiece 22 is closed by the glass faceplate 12 having on its inner surface an electrically conducting coating 14 made of tin oxide, for example, which serves as a signal electrode for the completely assembled vidicon. The coating 14 is connected along its circular periphery to an annular aluminum sealing ring 36 which is hermetically sealed between the faceplate 12 and workpiece 22. The ring 36 includes a lip which engages the external periphery of workpiece 22 to provide a means of heat conduction as hereinafter described, and a means of electrical connection to the coating 14. Upon the conducting coating 14, regions 16, and 18 of photoconductive material comprising primarily lead monoxide must be formed.

The upper end of manifold 32 is hermetically brazed or welded to a glass mounting base 38, and clamping member 40, which in turn is secured or anchored to the table 30. The base 38 supports a cylindrical glass pedestal 42 extending upward into workpiece 22. The upper end of the pedestal 42 is secured to a glass mounting base 44. The glass mounting bases 38 and 44 each include a plurality of axial passages (not shown) or apertures through their thickness by which there is provided relatively free axial passage of gas and/or vapor within the cylindrical interior of the tubular envelope workpiece 22 between the manifold 32 end of the workpiece 22 and the upper faceplate 12 end of workpiece 22.

The base 44 includes an annular lip region along its periphery upon which a glass cylindrical shield 46 may be engagingly mounted and retained by gravity in a substantially vertical position approximately in concentric telescopic relation to the sidewall inner cylindrical surface of the tubular envelope workpiece 22. The glass shield 46 extends vertically within the workpiece 22 and is spaced therefrom to form an intermediate cylindrically shaped gap or passage for providing an additional passageway through which gases and/or vapors may freely pass from the region of the faceplate 12 to that of the interior of manifold 32.

A cylindrical glass evaporation chimney 48 is mounted entirely within the interior of cylindrical shield 46 is concentric telescopic relation therewith by means of a plurality of glass spoke-like radial extensions 50. The chimney 48 includes upper and lower end openings which terminate within the cylindrical interior of the larger and longer cylindrical shield 46. The upper end opening of chimney 48 includes a glass cover member 52 which includes a magnetic material embedded within its volume. The cover 52 provides a magnetically removable shutter as hereinafter described.

A platinum bullet-shaped crucible 53 is mounted within the cylindrical interior of the chimney 48 for retaining and evaporating a measured quantity of lead monoxide source material disposed within a cavity 54 centrally located therein. An apertured lid 56 is provided to cover the crucible cavity 54. Removal of the lid 56 provides access to cavity 54 whereby a measured amount of PbO material may be introduced within cavity 54. The crucible 53 is fixably mounted within the interior of chimney 48 by means of a pair of supported wires 58, 60 of dissimilar metal compositions which extend through the manifold 32 external to apparatus 20. The wires 58, 60 may comprise, for example, material compositions of platinum and platinum-rhodium alloy, respectively, whereby a thermocouple is provided by which the temperature of the crucible may be electrically determined external to the apparatus 20.

A plurality of glass tubulations 62, 64, 66, 68 extend through, and are hermetically sealed to, the manifold 32. Tubulation 62 terminates within the manifold's interior and is externally connected to a source of nitrogen buffer gas, $N_2$, for example, through an adjustable dosing valve 70 by which the rate of introduction of this gas subsequent to processing may be accurately controlled, as hereinafter disclosed. Tubulations 64, 66, 68 additionally extend through the base 38 and terminate within the interior of workpiece 22 closely proximate to the gas passages through base 44. Tubulation 64 is externally connected to a source of oxygen. Tubulation 66 is externally connected to a source of deuterium oxide vapor. The rate of admission of vapor species ($D_2O$ and $O_2$) within the interior of workpiece 22 by tubualtions 64, and 66 is accurately controlled by adjustable "dosing" valves 74 and 72, respectively. Tubulation 68 is externally connected to a vacuum gauge, such as a Pirani gauge, for measuring the internal partial pressure of the vapor species within the interior of workpiece 22.

The throw distance "S" of the apertured lid 36 of crucible 53 from the inner surface of the faceplate 12 is adjusted so that uniform deposits are obtained when the workpiece 22 is vertically mounted to engage the upper annular end of manifold 32. The workpiece 22, once so positioned may be hermetically sealed to apparatus 20 by means of "O" ring 76 comprised of, for example, a silicone rubber material which may be compressed to hermetically seal the mating annular end surfaces of the manifold 32 with that of workpiece 22 by means of a threaded collar 78 which mechanically engages mating threads in the clamping member 40. Sealing compression of the O ring, and release of the workpiece 22 from the apparatus 20, may be easily accomplished by, respectively, screwing or unscrewing the threaded collar 78 within the clamping member 40.

During processing the faceplate 12 is maintained at a constant temperature by means of a removable temperature controlled heating block 80 comprising, for example, a copper block including an annular disc shaped receiving cavity 82 so dimensioned as to receivingly engage the external major surface of faceplate 12 and the aluminum lip 36 which is electrically connected to the conductive coating 14 or signal electrode. A thermocouple 84 is embedded within the block 80 to control the temperature thereof with an accuracy approximately ± 1° C. of the controlled temperature by means of external control apparatus (not shown). A removable silicone grease 86, or other suitable heat conducting media, is provided within receiving cavity 82 between the block 80 and faceplate 12 to provide increased heat conduction therebetween. During processing the crucible 53 is heated by RF induction by means of the removable coil 88 which may be positioned telescopically about the periphery of workpiece 22 at the axial location of the crucible 53.

THE METHOD

Preliminary to forming regions 16 and 18 on the interior surface of faceplate 12 the apparatus 20 is cleaned of all residual impurities which might later contaminate these layers. Cleaning may be, for example, accomplished by providing an auxillary cover bulb or envelope, in lieu of the workpiece 22 on the apparatus 20. The cover bulb may be sealed to the base 38, in the same manner as previously described for workpiece 22, to include telescopically within its interior all the internal components of apparatus 20 which are ordinarily included within the workpiece 22. Once the cover bulb has been hermetically sealed about the base 38, the bulb may be evacuated by the vacuum pump system interconnected to the manifold 34. Dosing valves 70–74 are all maintained in an off position thereby preventing the entry of gases or vapor into the cover bulb. Once the cover bulb has been evacuated, the interior components of apparatus 20 may be cleaned, by a high temperature bake out, comprising for example, maintaining the internal components of apparatus 20 within the cover bulb, at a temperature of 450° C. for a period of 60 minutes. Crucible 53 may also be simultaneously heated by means of coil 88 to remove by evaporation all residual PbO material which remains from a prior use of the apparatus 20.

If the prior cleaning operation is utilized, the cover bulb is thereafter removed by unscrewing the collar 78, and coaxially lifting the cover bulb from the internal components of apparatus 20. The glass shield 46 and chimney 48 are also removed to provide access to the crucible 53. The apertured lid 56 is then removed to provide access to the cavity 54 of crucible 53. A suitable charge of substantially pure lead monoxide material is carefully placed within the cavity 53. The volume of PbO material introduced into cavity 54 must relate closely to the cross-sectional area and thickness of the target layer which is later to be formed on the coating 14 of workpiece 22. The apertured lid 56 is then placed across the crucible as shown in FIG. 1.

The chimney assembly which comprises glass shield 46, chimney 48, and cover member 52, is thereafter positioned coaxially about the crucible 53 within the annular receiving lip along the periphery of mounting base 44. The workpiece 22, which comprises a vidicon envelope including faceplate 12, and a predeposited conductive coating 14 thereon, is thereafter coaxially positioned about the chimney in engagement with the upper annular mating surface of the manifold 32. The workpiece is then hermetically sealed to the apparatus 20 by screwing the collar 78 as previously described. Once sealed, the workpiece 22 is evacuated by the vacuum pump system interconnected to the orfice of the lower end 34 of manifold 32, to a vacuum level of approximately $10^{-6}$ torr. An oven is thereafter placed about the workpiece 22 and the internal components of apparatus 20, and the assembly heated to approximately 450° C. for a period of 60 minutes, for example, to bake out any remaining contaminents within the interior of the workpiece 22.

The previously described steps are intended to be illustrative of the cleaning and charging operation by which the workpiece 22 and the internal components of apparatus 20 may be prepared for the critical steps of evaporating and forming the target layer are not otherwise intended to be critical or limiting.

After bake out as above described, the internal components of apparatus 20 and workpiece 22 are cooled to room temperature; the RF heater coil 88 is coaxially mounted in horizontal alignment about the crucible 53 external to the workpiece 22; and the block heater 80 is placed on the faceplate 12 of workpiece 22 which has been precoated with a silicone grease, or other suitable conductive media, to suitable internestle in engagement within the receiving cavity 80.

During the formation of the target layer, the temperature of the block heater 80, and of the thermally connected faceplate 12 must accurately maintained at a temperature of between 100° and 120° C. ± 1° C. The temperature of the faceplate 12 is critical, as it has been discovered that the target layers 16 and 18 comprising primarily the desired lead monoxide may only be accomplished while maintaining the faceplate 12 within that temperature range. The desired lead monoxide material exhibits a tetragonal crystal structure with an energy band gap of about 2.0 eV. The crystallite size is also largely controlled by means of the temperature of faceplate 12.

The temperature of the faceplate 12 is uniformly established within the above defined temperature range by means of external heating and control apparatus (not shown) interconnected to thermocouple 84 within the block heater 80. Once the desired faceplate temperature has been achieved, the dosing valve 74 is opened to admit deuterium oxide vapor to the workpiece 22 interior at a dynamic flushing rate at which there is achieved a substantially constant measurement on the Pirani gauge, interconnected to tubulation 68, of approximately $1 \times 10^{-2}$ torr of pressure. A period of time approximately 5 to 10 minutes is thereafter required to establish a stable flushing rate of the interior of workpiece 22. The dosing valve 72 is then opened to also admit oxygen to the workpiece 22 interior at a dynamic flushing rate at which there is achieved a substantially constant partial pressure measurement of the pressure of oxygen on the Pirani gauge of approximately $3 \times 10^{-3}$ torr. It is preferable that the ratio of admission rates of the deuterium oxide and oxygen be about 10 to 3 as herein described. However, other ratios of deuterium oxide to oxygen may be employed to advantage wherein the partial pressure of deuterium oxide to the sum of the partial pressures of deuterium oxide and oxygen is from about 50 to about 80%. Also, the sum of the partial pressure of deuterium oxide and oxygen may be varied to advantage between from about $5 \times 10^{-3}$ to about $2 \times 10^{-2}$ torr. A period of time approximating 2 minutes is required to establish a stable flushing rate of the interior of workpiece 22. During the processing, the vapor species are continually pumped from the interior of the workpiece 22 by the vacuum pump system connected to the manifold 32.

Once a stable or equilibrium condition of the admitted oxygen and deuterium oxide vapor into the interior of workpiece 22 is established, the RF heating coil 88 is connected to a suitable source of RF energy by which controlled heating of crucible 53 is accomplished.

At this point in the processing, the crucible 53 is heated in timed sequence in accordance with the following preferable time-temperatue cycles with an accuracy of ± 10° C., as measured by the thermocouple consisting of wires 58 and 60, and externally associated equipment: (1) from room temperature to a melting point of lead monoxide, 880° C., over a period of about 10 minutes; (2) 880° C. for a period of about 1 minute; and lastly, (3) 950° – 1000° C. for a period of 1 to 1½ minutes. Inasmuch as the PbO material within crucible 53 only begins to vaporize substantially at temperatures exceeding 880° C., the melting point of PbO, occuring in step (3), steps (1)–(2) provide a series of additional baking or outgassing steps. The vaporization of the charge of PbO within cavity 54 initially is unstable for the period of 60–90 seconds during the period of step (3).

Once a stable rate of evaporation is achieved from apertured lid 56 of crucible 53, the cover member 52 is removed by external magnet means. The cover member acts as a magnetically controlled shutter across the upper opening of the chimney 48. Evaporation of the PbO charge within crucible 53 is thereby begun from the chimney 48 and is continued until the temperature of the crucible increases rapidly thereby indicating a substantial depletion of the PbO charge.

During the previously described heat evaporation step, subsequent to step (3) and the removal of cover member 52, oxygen and deuterium oxide vapor flushing of the workpiece 22 interior is maintained while simultaneously providing, as previously described, a substantially uniform faceplate temperature of between 100° and 120° C. ± 1° C. In this manner, it has been found that a relatively homogeneous layer comprising primarily of lead monoxide may be formed on the coating 14 and that a controlled thickness thereof may be obtained by carefully adjusting the charge of PbO previously inserted within the crucible 53. For example, it has been found that the previously described process may be utilized to form a substantially uniform and homogeneous 20 micron thickness of PbO on the coating 14 corresponding to the combined thickness of regions 16 and 18 wherein the faceplate 12 and its signal electrode 14 define a diameter of about 27 mm. The requisite charge of source material for forming such a target layer on a coating 14, may comprise, for example, a cylindrically shaped charge of lead monoxide powder defining a diameter of 6.5 mm. and a thickness of 9 mm.

Once the temperature of the crucible 53, as externally monitored by means comprising wires 58 and 60, begins rising at a rapid rate (ie. for a given approximately constant RF energy source connected to coil 88) the RF energy source connected to coil 88 is turned off; the heater block 80 is removed from the faceplate 12; the oxygen dosing valve 72 and the deuterium oxide vapor dosing valve 74 are turned off. The target layer is thereafter cooled and the interior of the workpiece 22 is evacuated by the vacuum pump system.

Dosing valve 72 is adjusted to admit oxygen to the interior of workpiece 22 at a rate at which there is achieved a substantially constant pressure measurement on the Pirani gauge, interconnected to tubulation 68, of preferably between about $4 \times 10^{-2}$ torr to about $6 \times 10^{-2}$ torr; however, a pressure level of about $4 \times 10^{-2}$ torr is particularly desirable. Other oxygen pressure levels from about $2 \times 10^{-2}$ to about $8 \times 10^{-2}$ torr may be employed to advantage.

Once a stable flushing rate for oxygen has been achieved within the interior of workpiece 22 a source of electrical glow discharge direct potential is interconnected to the coating 14 and to the crucible 53 by means of an electrical connection to ring 36 and wires 58 or 60, respectively. The potential so applied preferably is approximately 900–1000 volts, however, differing potentials may be provided to advantage by persons skilled in the art. Preferably, the signal electrode (coating 14) is connected to a source of negative electrical potential. This results in a doping of the exposed target layer by positive oxygen ions resulting in the formation of a material region 18 of p-type conductivity along the exposed surface of the target layer previously formed. A signal electrode current of approximately 60 microamperes for example, has been found to be associated with the appropriate application of direct current potential as herein described, of about 1000 volts in which the target 10 includes a diameter of about 27 mm. The glow discharge is preferably continued for a period of 60 seconds. However, other time periods of from 1–5 minutes may be utilized to advantage. The potential applied to the signal electrode and the crucible 53 is disconnected at the termination of a suitable glow discharge time period.

The glow discharge operation above described, completes the process by which regions 16, 18 are formed within the layer of PbO deposited on coating 14, as previously described. After the glow discharge operation, the dosing valve 72 is closed and the vacuum system attached to manifold 32 is shut "off" after oxygen has been evacuated from the interior of workpiece 22 to a pressure level of about $10^{-7}$ torr. A buffer gas of nitrogen is thereafter admitted to the interior of workpiece 22 by means of dosing valve 70, until atmospheric pressure is achieved within the interior of workpiece 22.

Once atmospheric pressure is achieved by the introduction of the nitrogen buffer gas within the interior of workpiece 22, collar 78 is unscrewed, and the workpiece 22 is removed and transferred, for completion of a vidicon target assembly, to an evacuation sealing apparatus such as described in the previously referred to Patent issued to A. D. Eyster. The assembly of the workpiece 22 as part of an operative vidicon is there described and its disclosure in that regard, is herein incorporated by reference.

It has been well known, from the prior art, that oxygen ($O_2$) and water ($H_2O$) vapors are desired processing agents for the manufacture of lead monoxide target layers of the type described. Oxygen is required to retain the stoichiometry and to control the p-type conductivity. The role of water, however, is less understood. It has been known to be an n-type dopant to the lead monoxide, and have the effect of reducing the crystallite size, thus improving the resolution.

We have found that when deuterium oxide ($D_2O$) is used to substitute for water ($H_2O$), tubes with unexpectedly improved properties are obtained. The improvement is in the hole transport properties (resulting in enhanced blue light saturation characteristics) and in the transient response lag properties. Under optimum conditions of deposition, layers which are manufactured with deuterium oxide exhibit reproducible and superior properties, when used as a target in the vidicon television camera tubes. The superior properties include outstanding lag characteristics even at low light levels, and highly saturated blue light photosensitivity with respect to the target voltage. The later property is a measure of the high stability of the target against dark current breakdown.

Lag is conventionally expressed as a percent of the final (or initial) photocurrent value reached at a specific time after an increase (or cut-off) of illumination. Tubes having target layers manufactured, as herein disclosed, have shown an improvement of their average 3rd field (1/30 sec.) decay lag characteristics of 25 and 45% at photocurrents of 50 nA. and 100 nA., respectively. Similar or better improvements have been observed in the building lag characteristics for such tubes.

For simplicity of expression, target layers manufactured by the foregoing process have been generally referred to as being of the "lead monoxide" type. While such target layers comprise primarily lead monoxide (PbO) having a tetragonal crystalline structure, other forms of oxides of lead may be present in minor quantities.

What we claim is:

1. A method of manufacturing a photosensitive device comprising the step of vapor depositing in an atmosphere containing oxygen and vapors of deuterium oxide a layer comprising primarily lead monoxide on a support which is at a temperature between about 100° and about 120° C., the partial pressure of said deuterium oxide vapors being initially about 50 to about 80% of the sum of the partial pressures of oxygen and deuterium oxide, said sum being from about $5 \times 10^{-3}$ to about $2 \times 10^{-2}$ torr.

2. The method of claim 1 additionally including the step of biasing selected areas of said layer negatively to effect an electrical discharge through an atmosphere containing oxygen at a pressure of from about $2 \times 10^{-2}$ to about $8 \times 10^{-2}$ torr to form oxygen ions which bombard said areas.

3. The method of claim 2 wherein a bias voltage is applied to said selected areas from approximately 900 to 1000 volts D.C. during said electrical discharge.

4. The method of claim 3, wherein the partial pressure of said deuterium oxide is about 75% of said sum.

5. The method of claim 4, wherein said sum of the partial pressures of oxygen and deuterium oxide is about $1.3 \times 10^{-2}$ torr.

* * * * *

UNITED STATES PATENT OFFICE
CERTIFICATE OF CORRECTION

Patent No. 4,001,099  Dated January 4, 1977

Inventor(s) Chih Chun Wang et al.

It is certified that error appears in the above-identified patent and that said Letters Patent are hereby corrected as shown below:

IN THE REFERENCES:

"De Haan" should be --De Haan et al.-- (all three occurrences)

Column 2, line 53: after "of" insert --the--.

63: after "with" insert --a--.

65: change "absorption" to --adsorption--.

Column 3, line 45: change "in" to --is--.

Column 4, line 36: add quotes to O such as "O".

Column 5, line 67: change "suitable" to --suitably--.

UNITED STATES PATENT OFFICE
CERTIFICATE OF CORRECTION

Patent No. 4,001,099          Dated January 4, 1977

Inventor(s) Chih Chun Wang et al

It is certified that error appears in the above-identified patent and that said Letters Patent are hereby corrected as shown below:

Column 6, line 3:    after "must" insert --be--.

39:    change "pressure" to --pressures--.

54:    change "temperatue" to --temperature--.

Column 7, line 55:    after "direct" insert --current--.

Column 8, line 64:    change "building" to --buildup--.

Signed and Sealed this

Seventeenth Day of May 1977

[SEAL]

*Attest:*

RUTH C. MASON
*Attesting Officer*

C. MARSHALL DANN
*Commissioner of Patents and Trademarks*